US009824866B2

(12) United States Patent
Kagoshima et al.

(10) Patent No.: US 9,824,866 B2
(45) Date of Patent: Nov. 21, 2017

(54) PLASMA PROCESSING METHOD (71) Applicant: Hitachi High-Technologies Corporation, Yamaguchi (JP)

(72) Inventors: Akira Kagoshima, Kudamatsu (JP); Daisuke Shiraishi, Hikari (JP); Yuji Nagatani, Hikari (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 656 days.

(21) Appl. No.: 14/449,516

(22) Filed: Aug. 1, 2014

(65) Prior Publication Data

US 2014/0339193 A1 Nov. 20, 2014

Related U.S. Application Data

(62) Division of application No. 13/356,676, filed on Jan. 24, 2012, now Pat. No. 8,828,184.

(30) Foreign Application Priority Data

Nov. 15, 2011 (JP) ................................ 2011-249242

(51) Int. Cl.
*H01J 37/32* (2006.01)
*H01L 21/66* (2006.01)
(Continued)

(52) U.S. Cl.
CPC .......... *H01J 37/3299* (2013.01); *G05B 13/00* (2013.01); *G05B 13/021* (2013.01);
(Continued)

(58) Field of Classification Search
None
See application file for complete search history.

(56) References Cited

U.S. PATENT DOCUMENTS 5,526,293 A 6/1996 Mozumder et al.
6,799,078 B1 9/2004 Berkooz et al.
(Continued)

FOREIGN PATENT DOCUMENTS

JP 2003-17471 1/2003
JP 2003-017471 1/2003
(Continued)

*Primary Examiner* — Jiong-Ping Lu
(74) *Attorney, Agent, or Firm* — Baker Botts L.L.P.

(57) ABSTRACT

Method for carrying out plasma processing on a wafer under Run-to-Run control by using a plasma processing apparatus having a plasma processing chamber, a process monitor which monitors a condition in the plasma processing chamber, and an actuator which controls parameters which are constituent elements of a plasma processing condition. The method includes the steps of making one of the parameters a (N–1)th manipulated variable, calculating a first difference between a process monitor value in the plasma processing obtained by the process monitor and a desired value of the process monitor value in the plasma processing, calculating a correction amount of the (N–1)th manipulated variable on the basis of the first difference and a previously obtained correlation between the process monitor value in the plasma processing and the (N–1)th manipulated variable, wherein N is a natural number equal to or larger than 2.

7 Claims, 5 Drawing Sheets

(51) Int. Cl.
*G05B 13/00* (2006.01)
*G05B 19/418* (2006.01)
*G05B 13/02* (2006.01)
*G05B 13/04* (2006.01)

(52) U.S. Cl.
CPC ....... *G05B 13/042* (2013.01); *G05B 19/4184* (2013.01); *H01J 37/32449* (2013.01); *H01J 37/32926* (2013.01); *H01J 37/32935* (2013.01); *H01L 22/20* (2013.01); *H01L 22/26* (2013.01); *H01J 2237/3343* (2013.01)

(56) References Cited

U.S. PATENT DOCUMENTS

| | | |
|---|---|---|
| 2003/0201256 A1* | 10/2003 | Tauchi .............. H01J 37/32082 219/121.42 |
| 2005/0171626 A1 | 8/2005 | Schwarm |
| 2005/0267607 A1 | 12/2005 | Paik |
| 2009/0162950 A1* | 6/2009 | Kuboi ................. H01J 37/3299 438/5 |
| 2012/0101622 A1 | 4/2012 | Yun |

FOREIGN PATENT DOCUMENTS

| | | |
|---|---|---|
| JP | 2003-68717 | 3/2003 |
| KR | 2003-0003641 | 1/2003 |
| KR | 10-2007-0117579 | 12/2007 |
| WO | WO 2011002798 | 1/2011 |

\* cited by examiner

PLASMA PROCESSING METHOD

CROSS REFERENCE TO RELATED APPLICATION

This application is a divisional application of U.S. application Ser. No. 13/356,676, filed Jan. 24, 2012, the contents of which are incorporated herein by reference.

BACKGROUND OF THE INVENTION (1) Field of the Invention

The present invention relates to a plasma processing apparatus and a plasma processing method and, more particularly, to a plasma processing apparatus and a plasma processing method that make it possible to restrain influences attributable to fluctuations in process performance, which occur as plasma processing proceeds.

(2) Description of Related Art

As a plasma processing apparatus, there has been known, for example, a plasma etching apparatus adapted to introduce an etching gas into a vacuum processing chamber to generate plasma under reduced pressure and to cause radicals or ions generated by the plasma to react with a wafer surface, which is an object to be processed, thereby accomplishing plasma etching.

In the aforesaid plasma processing apparatus, with scaling down of semiconductor devices, it has been becoming difficult to obtain desired processing performance (hereinafter referred to as "process performance") each time due to various disturbances even if the processing is carried out under the same manufacturing condition (hereinafter referred to as "recipe").

Accordingly, as a solution thereto, an advanced process control technique (hereinafter referred to as "APC"), which is capable of restraining the influences of disturbances, has been adopted. The APC is a method, in which, normally, plasma processing to be carried out according to a preset recipe is performed while conducting feedback control or feedforward control thereby to dynamically correct the recipe.

In particular, a control method for restraining fluctuations in process performance by correcting a recipe, which is a processing condition, for each processing cycle, such as for each wafer or each lot, is also reputed to be "Run-to-Run control" (hereinafter referred to as "Run-to-Run control"). A recipe includes a plurality of processing condition items (hereinafter referred to as "parameters"), such as a radio-frequency power, a gas flow rate, a pressure, and processing time. One or more parameters among these parameters are corrected by the Run-to-Run control.

For example, a plasma etching apparatus normally carries out plasma etching according to the processing conditions specified by a recipe. However, the process performance results (e.g., etching rate, processing dimensions or the like in the case of a plasma etching apparatus) inconveniently fluctuate with time in some cases due to substances adhering to the inner wall of a plasma etching chamber, or changes in the wear on components in the plasma etching chamber. In order to reduce or prevent the aforesaid time-dependent fluctuations, the Run-to-Run control for correcting a recipe for each processing cycle is applied.

As an example of the Run-to-Run control, JP-A-2003-017471 discloses a plasma processing apparatus carrying out processing on a workpiece placed in a vacuum processing chamber, and that plasma processing is controlled according to a recipe generated by an optimum recipe calculation model on the basis of sensors that monitor processing amounts during processing and the estimation results of a processing result estimation model.

Further, JP-A-2003-068717 discloses a semiconductor processing apparatus which includes a sensor monitoring the processing condition of the semiconductor processing apparatus which processes a semiconductor wafer, a processing result input unit which inputs measured values of a processing result of the semiconductor wafer processed by the semiconductor processing apparatus, a model formula generating unit which generates a model formula for predicting a processing result on the basis of sensor data obtained by the sensor and the measured values by using the sensor data as an explanatory variable, a processing result predicting unit which predicts a processing result on the basis of the model formula and the sensor data, and a processing condition controlling unit which compares the predicted processing result with a set value established beforehand and controls a processing condition of the semiconductor processing apparatus so as to correct the difference therebetween.

In general, when a process performance result begins to deviate from a desired value, the Run-to-Run control functions to return the deviating result to the desired value. According to the method based on the Run-to-Run control, a correction amount of a parameter of a subject recipe is calculated on the basis of the difference between a process monitor value correlating with a process performance result and a target value of a process monitor value determined beforehand from a process performance result, and the corrected recipe is applied to the next plasma processing. Generally, however, a parameter of a recipe has an upper limit value and a lower limit value that can be corrected.

In the Run-to-Run control, carrying out plasma processing according to a particular recipe that has a parameter exceeding a predetermined range may adversely affect a process performance result. For example, in plasma etching, setting a radio-frequency bias power at a value that exceeds a predetermined value when controlling an etching depth by means of a radio-frequency bias power to be applied to a wafer may damage a mask member, leading to a problem, such as a failure to obtain a desired shape.

Meanwhile, the aforesaid parameter control range is subjected not only to process performance restrictions but also to hardware restrictions. For instance, in the case of a mass flow controller for controlling a gas flow rate, the control range will be a range of about 5% to about 100% of each full scale (maximum flow rate). This means that a gas flow rate exceeding the range cannot be controlled.

Accordingly, in the Run-to-Run control, a correction amount of a recipe is provided with an upper limit and a lower limit so as not to carry out the control beyond the range defined thereby. Normally, if a correction amount of a recipe deviates from the range, it is determined as a control error and plasma processing is interrupted. However, such the interruption of the plasma processing results in a significantly reduced operating rate of a plasma processing apparatus. For this reason, there has been a demand for Run-to-Run control that can reduce or restrain the interruption of plasma processing.

BRIEF SUMMARY OF THE INVENTION

The present invention has been made with a view toward solving the problem described above and provides a plasma processing apparatus and a plasma processing method that allow plasma processing to be carried out under Run-to-Run control whereby a stable process performance result can be obtained without deteriorating the operating rate of the apparatus.

A plasma processing apparatus in accordance with the present invention includes a plasma processing chamber in which plasma processing is carried out; a process monitor which monitors a condition in the plasma processing chamber; an actuator which controls a parameter constituting a plasma processing condition; N+1 correction amount calculating units which calculate a correction amount of a manipulated variable on the basis of a difference between a process monitor value obtained by the process monitor and a desired value of the process monitor and a correlation between the process monitor value and the manipulated variable, which is the aforesaid parameter, the correlation having been acquired in advance; and N manipulated variable adding units that add a manipulated variable having a priority level next to an N-th manipulated variable, wherein, in the case where a correction amount calculated by an N+1-th correction amount calculating unit does not cause an N+1-th manipulated variable to exceed a limit value, an N-th manipulated variable adding unit defines a correction amount calculated by the N+1-th correction amount calculating unit as the correction amount of an N+1-th manipulated variable.

Further, the present invention provides a plasma processing method for carrying out plasma processing on a workpiece under Run-to-Run control by using a plasma processing apparatus having a plasma processing chamber in which plasma processing is carried out, a process monitor which monitors a condition in the plasma processing chamber, and an actuator which controls a parameter constituting a plasma processing condition, wherein N+1 correction amount calculating units which calculate a correction amount of a manipulated variable on the basis of a difference between a process monitor value monitored by the process monitor and a desired value of the process monitor and a correlation between a process monitor value and a manipulated variable, which is the aforesaid parameter, the correlation having been acquired beforehand, and N manipulated variable adding units that add a manipulated variable having a priority level next to an N-th manipulated variable are provided, and in the case where the correction amount calculated by the N+1-th correction amount calculating unit does not cause an N+1-th manipulated variable to exceed a limit value, an N-th manipulated variable adding unit carries out Run-to-Run control, defining a correction amount calculated by the N+1-th correction amount calculating unit as the correction amount of the N+1-th manipulated variable.

The present invention has the construction described above, thus allowing plasma processing to be carried out by Run-to-Run control that makes it possible to obtain stable process performance results without deteriorating operation availability of the apparatus.

Other objects, features and advantages of the invention will become apparent from the following description of the embodiments of the invention taken in conjunction with the accompanying drawings.

DETAILED DESCRIPTION OF THE INVENTION

With reference to the accompanying drawings, the following will describe a mode, in which Run-to-Run control is conducted in a plasma etching apparatus, as a best mode to carry out the present invention.

There are a variety of processes of plasma etching processing, depending on materials to be etched, such as a silicon material and an insulating material. In the present embodiment, etching of a silicon nitride layer will be described as an example.

Figure 2:
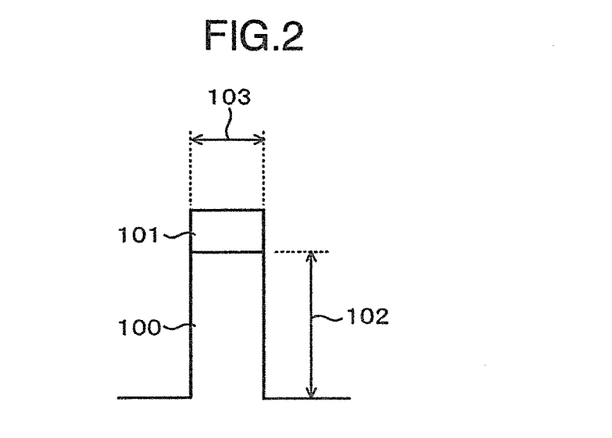
FIG. 2 is a diagram illustrating a result of plasma processing of a wafer by plasma etching.

FIG. 2 illustrates a simple example of etching a silicon nitride layer. The etching process of the silicon nitride layer is a process whereby to etch a silicon nitride layer 100 by using a mask material 101 as the mask. A gas for etching the silicon nitride layer may be, for example, a mixed gas of methyl fluoride gas ($CH_3F$ gas) and oxygen gas ($O_2$ gas), as shown in Table 1. Indexes for assessing etching performance typically include an etching depth 102 and a critical dimension (CD), such as a processing dimension 103. In a plasma etching apparatus, it is required to etch a workpiece, which has been carried into a plasma etching chamber, to desired CD values and etching depth configuration and to stably obtain a desired etching rate and CD values for each plasma etching process.

TABLE 1

| | |
|---|---|
| $CH_3F$ gas | 50 ml/min |
| $O_2$ gas | 30 ml/min |
| Processing pressure | 0.5 Pa |
| Microwave power (Power for generating plasma) | 1000 W |
| Radio-frequency bias power | 400 W |
| Processing time | 200 sec |

Plasma processing apparatuses, not applying only to a plasma etching apparatus, perform plasma processing by using a recipe, which indicates processing conditions. A recipe is normally composed of a plurality of parameters.

Parameters, for example, for a plasma etching apparatus include such as a gas flow rate, a processing pressure, plasma generating power, a radio-frequency bias power, and processing time, as shown in Table 1.

Normally, in a plasma processing apparatus, a single recipe is applied to each processing cycle. In other words, plasma processing is carried out by applying the same recipe each time as long as the specifications of wafers to be processed remain the same.

However, in a plasma etching apparatus, for example, as the number of processed wafers increases, the environment in the plasma processing chamber thereof changes due to the accumulation of the product of reaction between a wafer, which is a workpiece, and an etching gas on the inner wall of the plasma processing chamber, temperature changes in components in the plasma processing chamber, and the wear on the components in the plasma processing chamber. In recent years, with the trend toward the scaling down of a semiconductor device, the allowances of plasma processing conditions are becoming smaller, causing the aforesaid environmental changes in the plasma processing chamber to markedly affect plasma processing results. The environmental changes in the plasma processing chamber apply to all plasma processing apparatuses, including a plasma etching apparatus.

Figure 3:
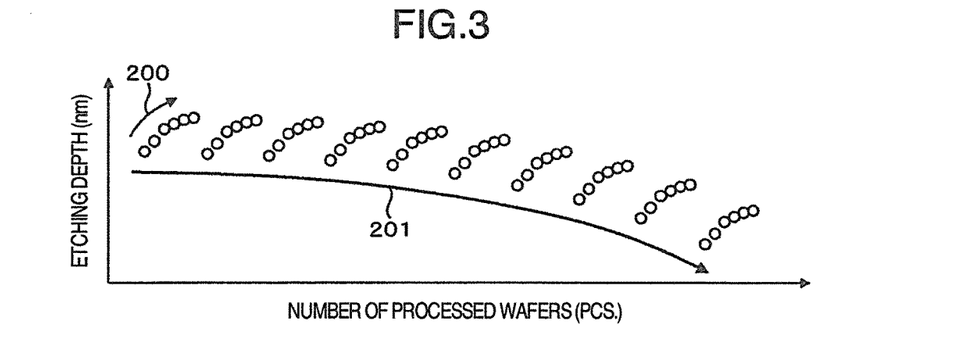
FIG. 3 is a diagram illustrating a time-dependent change in an etching depth.

FIG. 3 is a view plotting, in time series, the value of the etching depth 102 each time a wafer is processed, the etching depth 102 being one of the indexes used for judging etching results in the etching process of the silicon nitride layer shown in FIG. 2. FIG. 3 illustrates that each time the number of processed wafers increases, the etching depth 102 shifts in the direction indicated by a change 200 within a lot, which consists of 25 wafers, and a change 201 in the direction indicated by a change 201 among lots.

The diagram illustrates an example in which the time-dependent changes in the environment of the plasma etching chamber affect etching results. The change 200 within a lot is reset each time a lot is processed, because the environment of the plasma etching chamber is reset to a certain degree by carrying out pre-processing, such as plasma cleaning, before lot processing is started.

The change 200 within a lot and the change 201 among lots are to be avoided, because the changes are likely to cause characteristic failures that result in defective semiconductor devices or lead to processing failures in subsequent steps.

For the reasons described above, rather than continuing plasma processing on all wafers within a lot according to a preset recipe, the Run-to-Run control is applied whereby to dynamically correct the recipe for each wafer while monitoring a plasma processing condition.

In the present embodiment, there is described a plasma processing apparatus which, in the case where a correction amount of a recipe deviates from a control range, can carry out the Run-to-Run control capable of obtaining stable process performance results without interrupting plasma processing due to the deviation as a control error.

Figure 1:
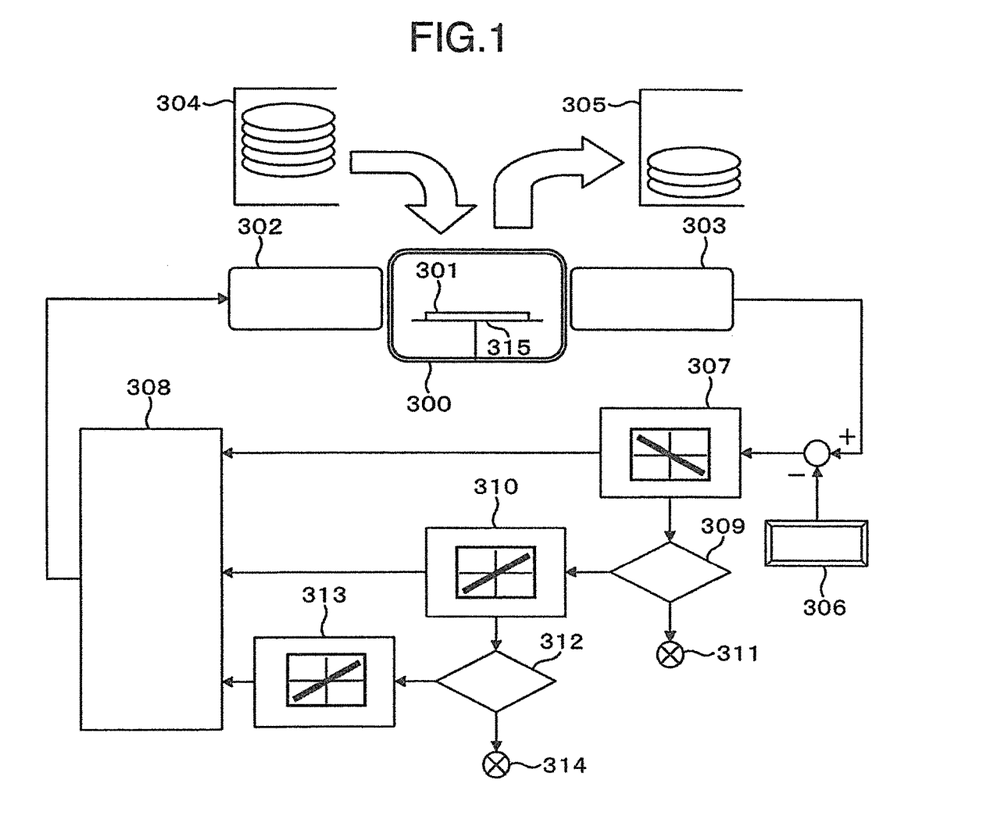
FIG. 1 is a schematic diagram of a plasma processing apparatus according to an embodiment of the present invention.

FIG. 1 is a schematic diagram of a plasma processing apparatus having a Run-to-Run control system according to an embodiment of the present invention.

The plasma processing apparatus includes a plasma processing chamber 300 in which a wafer 301, which is a workpiece placed on a workpiece table 315, is subjected to plasma processing, an actuator 302 which controls the parameters constituting a recipe, a process monitor 303 which monitors the condition in the plasma processing chamber 300, and a controller 308 which carries out control for performing the plasma processing by the Run-to-Run control on the wafer 301 carried into the plasma processing chamber 300.

The actuator 302 has a mass flow controller (not shown) which controls the flow rate of a gas supplied into the plasma processing chamber 300, a plasma generating power source (not shown) for supplying a radio-frequency power for generating plasma in the plasma processing chamber 300, a radio-frequency bias power source (not shown) which supplies a radio-frequency bias power to the workpiece table 315, and a pressure control valve (not shown) which controls the pressure in the plasma processing chamber 300.

The process monitor 303 may be, for example, a monitor which detects the flow rate of a gas supplied from the mass flow controller into the plasma processing chamber 300, or a detector which detects the traveling wave and the reflected wave of the radio-frequency power supplied into the plasma processing chamber 300 to generate plasma. The process monitor 303 further includes an optical emission spectroscopy (OES) monitor which analyzes the optical emission spectrum of the plasma generated in the plasma processing chamber 300, and a quadrupole mass spectrometry (QMS) device which analyzes the masses of plasma particles of the plasma generated in the plasma processing chamber 300.

The wafer 301 to be subjected to the plasma etching is carried by a carrying unit (not shown) from a wafer cassette 304 into the plasma processing chamber 300, and the plasma etching is performed in the plasma processing chamber 300 under a plasma processing condition called a recipe. Upon completion of the plasma etching, the wafer 301 is carried out from the plasma processing chamber 300 by the carrying unit (not shown) and placed in a wafer cassette 305. Then, the next wafer is carried from the wafer cassette 304 into the plasma processing chamber 300 in which the wafer is subjected to the plasma etching. Such the processing is repeated until all the wafers in the wafer cassette 304 are processed by plasma etching.

As described above, however, the time-dependent changes as illustrated in FIG. 3 occur in some cases when the plasma etching of all the wafers in the wafer cassette 304 is carried out by using the same recipe. As a solution thereto, the Run-to-Run control is applied. To carry out the Run-to-Run control, it is first required to determine a manipulated variable (parameter) having high controllability for an object to be controlled, namely, the etching depth in the present embodiment. To determine the manipulated variable, the correlation between a candidate parameter and the value of the object to be controlled is first determined in advance, and a parameter that is best suited to the object to be controlled is determined as the manipulated variable on the basis of the correlation determined in advance.

Figure 4:
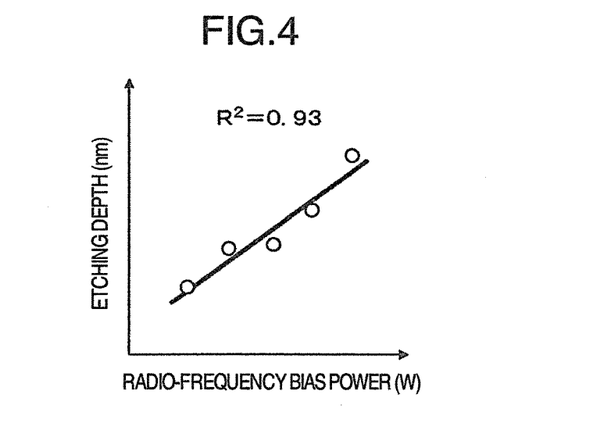
FIG. 4 is a diagram illustrating a correlation between a radio-frequency bias power, which is a first manipulated variable, and an etching result.

For example, if there is a close correlation between the radio-frequency bias power, which is one of the parameters, and the etching depth 102, as illustrated in FIG. 4, then the radio-frequency bias power can be a manipulated variable candidate for the Run-to-Run control.

Figure 5:
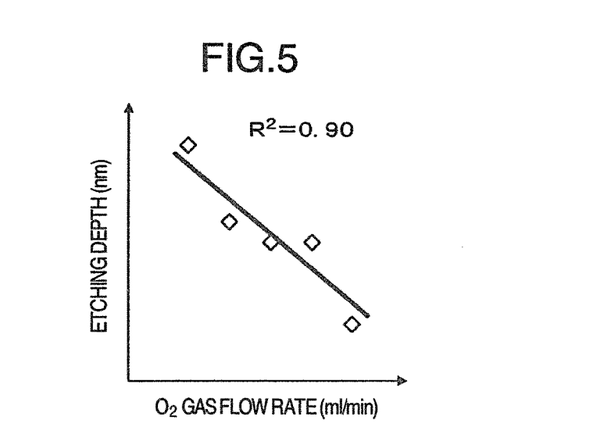
FIG. 5 is a diagram illustrating a correlation between a flow rate of an oxygen ($O_2$) gas, which is a second manipulated variable, and an etching result.

Further, if there is a close correlation between another parameter, e.g., the flow rate of the oxygen ($O_2$) gas, which is one of the parameters of the recipe in etching the silicon nitride layer shown in Table 1, and the etching depth 102, as illustrated in FIG. 5, then the flow rate of the oxygen ($O_2$) gas can also be a manipulated variable candidate for the Run-to-Run control.

Thus, if there are a plurality of manipulated variable candidates, each of the plurality of manipulated variable candidates is assigned a priority level according to the level of closeness to the etching depth 102, which is the object to be controlled. For example, the priority ordering may be set such that a radio-frequency bias power whose coefficient of correlation ($R^2$), which represents the degree of matching to a regression line, has a large value is defined as the first manipulated variable, and the flow rate of the oxygen ($O_2$) gas may be defined as the second manipulated variable.

The radio-frequency bias power is used to control only the etching depth 102. If, however, the flow rate of the oxygen ($O_2$) gas is known to influence not only the etching depth 102 but also a CD, which is the processing dimension 103, to some extent, then this side effect may be taken into account for the aforesaid coefficient of correlation. Hence, the priority ordering may be set such that the radio-frequency bias power is defined as the first manipulated variable and the flow rate of the oxygen ($O_2$) gas is defined as the second manipulated variable.

Further, to carry out the Run-to-Run control for each wafer processing cycle, an etching result must be measured for each wafer. The etching result in the present embodiment is indicated by the etching depth 102. To measure the etching depth 102, however, wafers must be carried to optical measuring equipment, which typically carries out optical critical dimension (OCD) measurement, or other measuring equipment. To conduct the Run-to-Run control for each wafer processing cycle, the etching result must be known immediately after the etching.

Therefore, a method for estimating processing conditions, such as plasma emission, by utilizing information that can be monitored during plasma processing is used rather than directly measuring the etching results. If there is a correlation between a process monitor value and a plasma processing result, then the plasma processing result can be replaced by monitor values.

Figure 6:
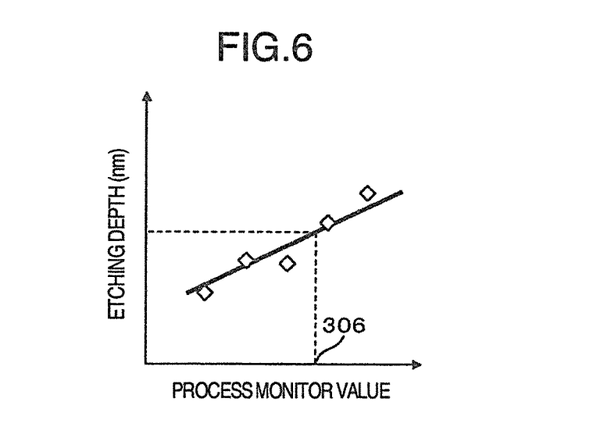
FIG. 6 is a diagram illustrating a correlation between a process monitor value and an etching result.

For example, if there is the correlation between the etching depth 102 and process monitor values as shown in FIG. 6, then it can be said that the process monitor values replace indirectly measured etching depths. As the process monitor value in this case, the emission intensity (emission intensity of a 385-nm wavelength) of CN, which is the product of reaction from etching the silicon nitride layer or the like, is used. In the present embodiment, the emission intensity is used as the process monitor value. Then, a desired value 306 of the process monitor value in the Run-to-Run control is determined in advance according to the correlation between the process monitor value and the plasma processing result.

Referring to FIG. 1, the value of the process monitor 303 determined as described above is acquired each time a wafer is processed, and the difference between the acquired value and the desired value 306 of the process monitor value that has been set beforehand is calculated by a first correction amount calculating unit 307. Subsequently, the correction amount of the manipulated variable is calculated by the first correction amount calculating unit 307 by using the calculated difference and the correlation between the manipulated variable and the process monitor, which has been stored beforehand in the first correction amount calculating unit 307. The correction amount calculated by the first correction amount calculating unit 307 is inputted to the controller 308, and the correction amount is added to the parameter corresponding to the manipulated variable of the preset recipe for the next wafer.

Next, the controller 308 sends the recipe that has been corrected as described above to the actuator 302, and the next wafer is etched according to the corrected recipe.

Figure 7:
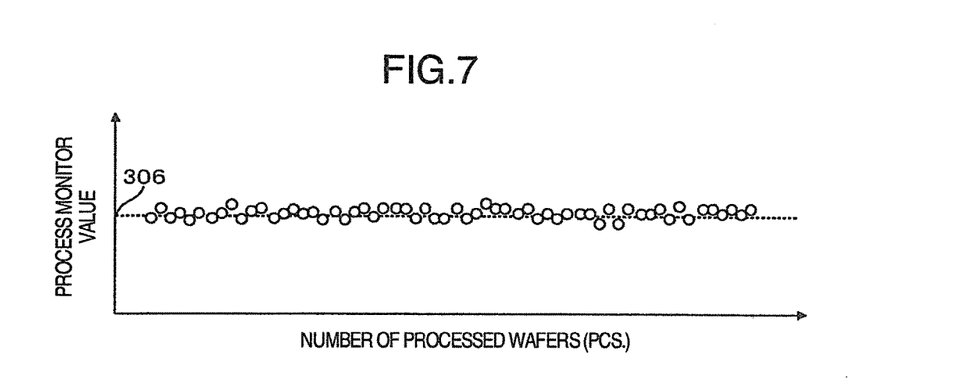
FIG. 7 is a diagram illustrating a result obtained by controlling a process monitor value to a desired value by Run-to-Run control.
Figure 8:
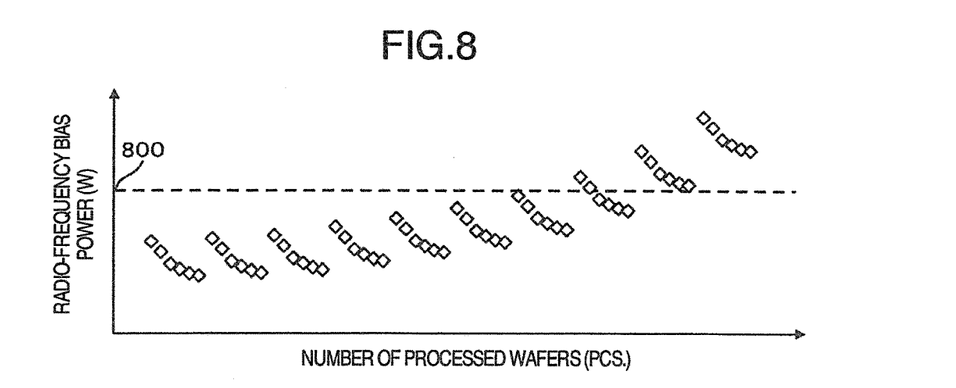
FIG. 8 is a diagram illustrating, in time-series, correction amounts of the first manipulated variable provided under Run-to-Run control.

FIG. 7 illustrates an example in which the value for each wafer processing cycle in the process monitor is plotted in time series when the Run-to-Run control is carried out using only the radio-frequency bias power, which is the first manipulated variable. Further, FIG. 8 illustrates an example in which the value for each wafer processing cycle at the radio-frequency bias power is plotted in time series when the Run-to-Run control is carried out using only the radio-frequency bias power, which is the first manipulated variable.

Referring to FIG. 7, it is seen that the process monitor value is controlled to be the desired value 306 of the process monitor value. Further, as seen from FIG. 8, the radio-frequency bias power, which is a manipulated variable, is corrected as the number of processed wafers increases.

Regarding the radio-frequency bias power, which has been defined as the first manipulated variable in the present embodiment, if the value of the radio-frequency bias power is excessively high, then the mask material 101 will be damaged while the silicon nitride layer is being etched, making it difficult to obtain a desired etching configuration. To obviate the problem, the upper limit value of the radio-frequency bias power in the present embodiment is set to an upper limit value 800, as shown in FIG. 8, so as to prevent any correction that would cause the radio-frequency bias power to exceed the upper limit value 800 thereof. In other words, the control range of the correction amounts of manipulated variables is defined such that a manipulated variable will not exceed a preset upper limit value and a preset lower limit value of the manipulated variable.

Thus, in the Run-to-Run control according to the present invention, if the correction amount of the first manipulated variable calculated by the first correction amount calculating unit 307 exceeds a control range, then the correction amount of the second manipulated variable will be calculated while keeping the correction amount of the first manipulated variable as the upper limit value or the lower limit value of the control range, and the Run-to-Run control is continued.

More specifically, if the correction amount of the first manipulated variable calculated by the first correction amount calculating unit 307 exceeds the control range, then the correction amount of the first manipulated variable is set as the upper limit value or the lower limit value of the control range, and a first manipulated variable addition determining unit 309 determines whether there is a manipulated variable that can be added. As described above, according to the present embodiment, the flow rate of the oxygen ($O_2$) gas has been defined as the second manipulated variable. Hence, the first manipulated variable addition determining unit 309 adds the flow rate of the oxygen ($O_2$) gas as the second manipulated variable, and then a second correction amount calculating unit 310 calculates the flow rate of the oxygen ($O_2$) gas. The correction amount of the flow rate of the oxygen ($O_2$) gas calculated by the second correction amount calculating unit 310 is inputted to the controller 308 and added to the flow rate value of the oxygen ($O_2$) gas of the preset recipe for the next wafer. Then, the next wafer is etched according to the corrected recipe for the next wafer.

In the case where there is no second manipulated variable, which is different from the case of the present embodiment, the first manipulated variable addition determining unit 309 does not carry out control for addition of a manipulated variable that is different from the first manipulated variable, and interrupts the plasma processing, indicating occurrence of a control error (311).

Figure 9:
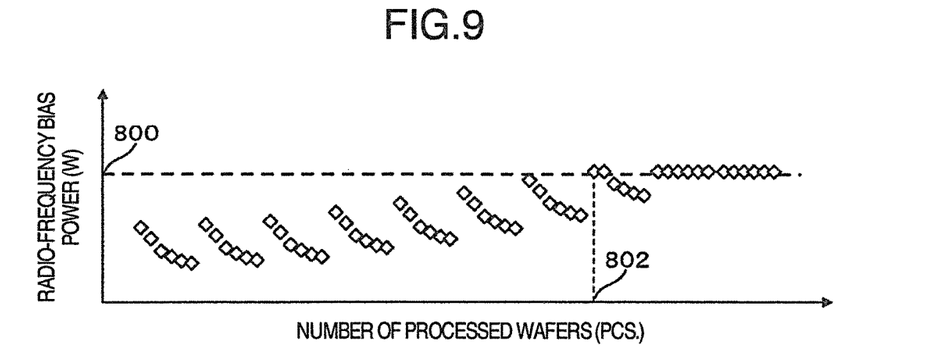
FIG. 9 is a diagram illustrating, in time-series, correction amounts of the radio-frequency bias power in the case where the second manipulated variable is added and the Run-to-Run control is continued.
Figure 10:
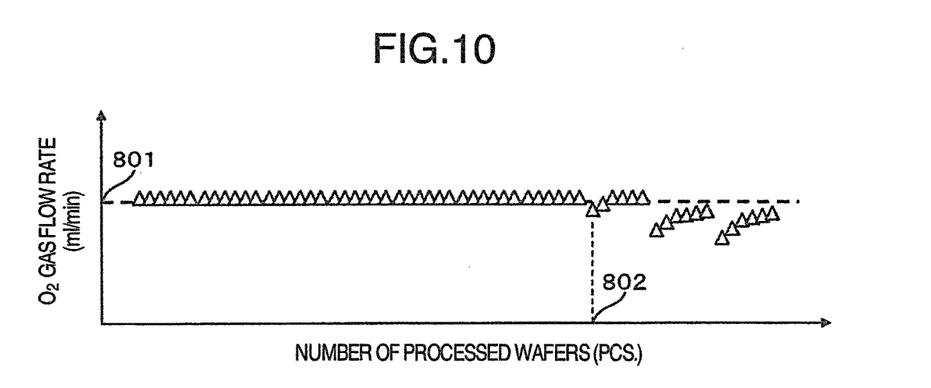
FIG. 10 is a diagram illustrating, in time-series, correction amounts of a flow rate of an oxygen ($O_2$) gas in the case where the second manipulated variable is added and the Run-to-Run control is continued.

FIGS. 9 and 10 illustrate the behaviors from the corrected first manipulated variable and the corrected second manipulated variable when the second manipulated variable is added as described above and the Run-to-Run control is continued.

FIG. 9 is a graph illustrating in time series the correction amount of the radio-frequency bias power, which is the first manipulated variable, when the second manipulated variable is added and the Run-to-Run control is continued. Corrections are made on the basis of the radio-frequency bias power until the number of processed workpieces reaches a number of processed workpieces 802, which exceeds the upper limit value 800 of the radio-frequency bias power. It is seen that after the number of processed workpieces reaches the number 802, which exceeds the upper limit value 800 of the radio-frequency bias power, no correction is made that would cause the radio-frequency bias power to exceed the upper limit value 800 of the radio-frequency bias power.

Meanwhile, according to FIG. 10, the flow rate of the oxygen ($O_2$) gas remains constantly at a flow rate of the oxygen ($O_2$) gas 801 and no correction of the flow rate of the oxygen ($O_2$) gas is made until the number of the processed workpieces reaches the number of processed workpieces 802, which exceeds the upper limit value 800 of the radio-frequency bias power. After the number of the processed pieces reaches the number 802, which exceeds the upper limit value 800 of the radio-frequency bias power, corrections are made on the basis of the flow rate of oxygen ($O_2$) gas, which is the second manipulated variable, in place of the radio-frequency bias power, which is the first manipulated variable.

Thus, carrying out the Run-to-Run control according to the present invention makes it possible to restrain damage to the mask material 101 caused by an increase in the radio-frequency bias power value and to obtain stable, desired process performance results even when the number of processed workpieces increases. In other words, the Run-to-Run control system according to the present invention uses the second manipulated variable to complementarily control a range that cannot be controlled by the first manipulated variable.

Further, if a control range is exceeded even after the second manipulated variable is used, then a third manipulated variable may be added. For example, if the correction amount of the second manipulated variable calculated by the second correction amount calculating unit 310 exceeds a control range, then the correction amount of the second manipulated variable is set as the upper limit value or the lower limit value of the control range, and a second manipulated variable addition determining unit 312 determines whether a third manipulated variable can be added. When the third manipulated variable can be added, then the correction amount of the third manipulated variable is calculated by a third correction amount calculating unit 313.

Subsequently, the correction amount of the third manipulated variable calculated by the third correction amount calculating unit 313 is inputted to the controller 308 and added to the value of a parameter corresponding to the third manipulated variable in the recipe set beforehand for the next wafer. The next wafer is etched according to the corrected recipe for the next wafer. If there is no third manipulated variable, then the second manipulated variable addition determining unit 312 does not carry out additional control on the basis of a manipulated variable that is different from the first manipulated variable and the second manipulated variable, and interrupts the plasma processing, indicating occurrence of a control error (314).

Figure 11:
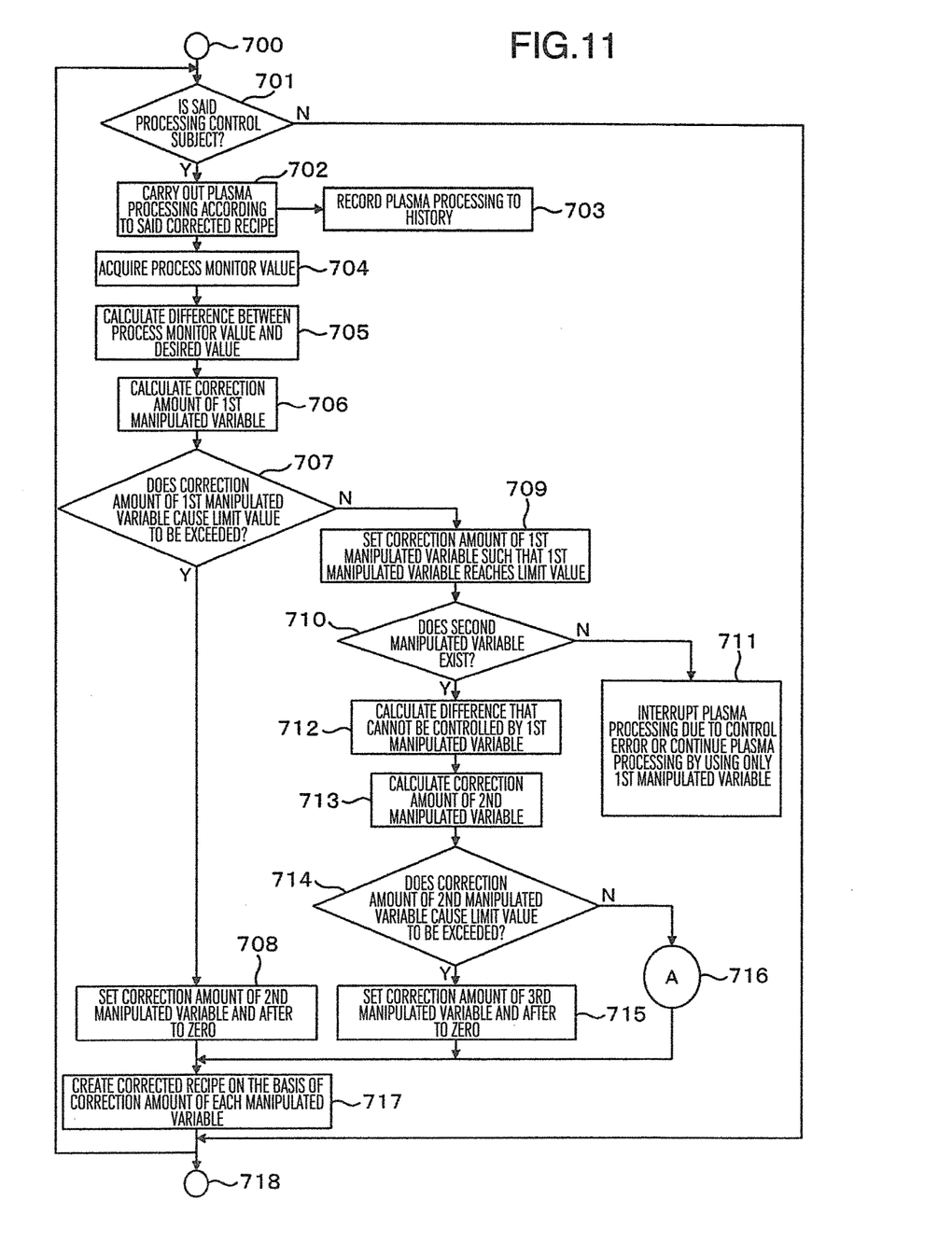
FIG. 11 is a flowchart illustrating the Run-to-Run control according to the present invention.

The flow of the Run-to-Run control according to the present invention described above will now be described with reference to FIG. 11.

Step 700 denotes a start point of the Run-to-Run control of the plasma processing apparatus in accordance with the present invention or a restart point of the Run-to-Run control when the environmental condition in the plasma processing chamber 300 is reset to an initial condition after plasma cleaning or the like.

In step 701, it is determined whether the plasma processing is plasma processing to be subjected to the Run-to-Run control. If it is the plasma processing to be subjected to the Run-to-Run control, then the system proceeds to processing based on Y (Yes), and if it is not the plasma processing to be subjected to the Run-to-Run control, then the system proceeds to processing based on N (No). The Run-to-Run control is basically applied only to plasma processing that is to be subjected thereto.

For example, in the case where plasma processing to be subjected to the Run-to-Run control is the plasma processing on a product wafer, the plasma cleaning or the like, which is plasma processing carried out while a product wafer is being plasma-processed, is not subjected to the Run-to-Run control. A recipe is not corrected in such plasma processing to which the Run-to-Run control is not applied. If it is determined that the plasma processing is not to be subjected to the Run-to-Run control, then the system proceeds to the next plasma processing, as illustrated by the flowchart.

In step 702, the processing is carried out according to the corrected recipe prepared in step 717 in the last cycle. If the processing in step 702 of the current cycle is the first processing since the start at step 700 and no processing has been carried out in step 717 in the last cycle, then the plasma processing is carried out according to an uncorrected recipe that has been set beforehand. In step 703, the history of the correction amount of the recipe used for the plasma processing that has been carried out is stored.

Subsequently, in step 704, a process monitor value indicative of the results of monitoring the condition in the plasma processing chamber 300 in which the plasma processing is being carried out is acquired. The process monitor value may be, for example, the plasma emission intensity for each particular wavelength acquired during plasma processing or the ratio of plasma emission intensities of a plurality of wavelengths.

In step 705, the difference between the process monitor value acquired in step 704 and a preset desired value is calculated.

In step 706, the correction amount of the first manipulated variable is calculated on the basis of the difference calculated in step 705 and the correlation between the first manipulated variable that has been acquired beforehand and the process monitor value.

Subsequently, in step 707, it is determined whether the correction value calculated in step 706 would cause the first manipulated variable to exceed a limit value of the first manipulated variable when the correction amount calculated in step 706 is applied to a parameter corresponding to the first manipulated variable of the recipe for the next wafer. The limit value refers to the threshold value of the manipulated variable, i.e., a parameter of the recipe, which adversely affects processing results. More specifically, the limit value means the upper limit value or the lower limit value of a parameter of the recipe. The aforesaid upper limit value or the lower limit value is a value specified on the basis of a processing result, but may be specified on the basis of the hardware of the actuator 302.

In step 707, it is determined whether the correction amount calculated in step 706 will cause the limit value of the first manipulated variable to be exceeded. If it is determined that the limit value will not be exceeded, then the system proceeds to the processing based on Y (Yes), and in step 708, the correction amount of the first manipulated variable is set to the correction amount calculated in step 706, and if there is a manipulated variable of the second manipulated variable or after, then the correction amount of the manipulated variable of the second manipulated variable or after will be set to zero.

More specifically, even if a recipe is corrected on the basis of the correction value calculated in step 706, when the first manipulated variable does not exceed the limit value, then it means that the subject to be controlled can be controlled by using only the first manipulated variable. Hence, the parameter corresponding to the manipulated variable of the second manipulated variable or after remains the same as in the recipe that has been set beforehand.

If it is determined in step 707 that the correction value calculated in step 706 causes the first manipulated variable to exceed the limit value of the first manipulated variable, then the system proceeds to the processing based on N (No). Subsequently, in step 709, the correction amount of the first manipulated variable is set to the correction amount that causes the first manipulated variable to reach the limit value. This is because, if the first manipulated variable exceeds the limit value, then the plasma processing result will be adversely affected, so that the correction amount of the first manipulated variable must be set to a correction amount that will not cause the limit value to be exceeded. Any correction amount of the first manipulated variable may be applied as long as it is less than the correction amount that causes the first manipulated variable to reach the limit value. In this case, however, it is required that the correction amount of the second manipulated variable and after does not exceed the control range of the correction amount of each manipulated variable.

Subsequently, in step 710, it is determined whether a second manipulated variable exists. For this purpose, the correlation between each of a plurality of manipulated variables and the result of processing to be controlled is checked in advance to select a controllable manipulated variable. In the present embodiment, the manipulated variable is selected according to the closeness of correlation between each manipulated variable and a processing result. When a plurality of manipulated variables is selected, each manipulated variable is assigned a priority level and the correction amount is calculated, starting with a manipulated variable with a highest priority. The priority level for each of the manipulated variables in the present embodiment has been determined according to the closeness of the correlation between each manipulated variable and the processing result.

If it is determined in step 710 that no second manipulated variable exists, then the system proceeds to the processing based on N (No), and the Run-to-Run control interrupts the plasma processing as an error in step 711. Alternatively, the correction amount of the first manipulated variable may be set to a correction amount that causes the first manipulated variable to reach a limit value whereas maintaining the correction amount of the second manipulated variable at zero and the plasma processing may be continued. In this case, normally, the first manipulated variable is retained at the limit value, so that the process monitor value will not converge to a desired value. However, there are cases where the process monitor value gradually approaches the desired value due to the influence of, for example, the temperatures of components in the plasma processing chamber 300 that change as the number of processed workpieces increases. In such a case, the processing can be continued even when the correction amount of the first manipulated variable is set to the correction amount that causes the first manipulated variable to reach the limit value.

Further, if it is determined in step 710 that the second manipulated variable exists, then the system proceeds to the processing based on Y (Yes). Next, in step 712, an Nth correction amount calculating unit calculates an Nth difference between the monitor value in the plasma processing and a monitor value calculated as a case that the (N−1)th manipulated variable is a limit value.

Subsequently, in step 713, the correction amount of the second manipulated variable is calculated by using the difference calculated in step 712 and the correlation between the second manipulated variable acquired beforehand and the process monitor value.

Next, in step 714, it is determined whether the correction amount of the second manipulated variable calculated in step 713 would cause the second manipulated variable to exceed a limit value thereof when the correction amount of the second manipulated variable is applied to a parameter corresponding to the second manipulated variable of the recipe for the next wafer. If it does not exceed the limit value, then the system proceeds to the processing based on Y (Yes), and, in step 715, the correction amount of the second manipulated variable is defined as the correction amount calculated in step 713, and if there is a third manipulated variable or after, then the correction amount of the third manipulated variable or after is set to zero.

Further, in step 714, if the correction amount of the second manipulated variable causes the second manipulated variable to exceed the limit value, then the system proceeds to step 716 to carry out the processing based on N (No).

Character "A" of step 716 denotes steps 709 to 716 in which the first manipulated variable has been replaced by the second manipulated variable, the second manipulated variable has been replaced by the third manipulated variable, and the third manipulated variable has been replaced by a fourth manipulated variable, respectively, as described in steps 709 to 716. Further, the "A" denotes a recursive step processing, which includes its own step 716, and means that an "N-th manipulated variable" will be replaced by an "N+1-th manipulated variable" thereafter. In other words, the Run-to-Run control according to the present invention permits Run-to-Run control that applies up to N+1-th manipulated variable.

In step 717, the correction amounts of the first manipulated variable to the N+1-th manipulated variable calculated in up to the previous step or set to zero are applied to parameters corresponding to the individual manipulated variables in a recipe for the plasma processing to be subjected to the Run-to-Run control, thereby preparing a corrected recipe. At this time, the current corrected recipe is determined by referring also to the correction amounts of the manipulated variables in the past that have been recorded in step 703. This corrected recipe is retained until the processing in step 702 of the next cycle is carried out.

The Run-to-Run control is repeatedly carried out by repeating the series of steps described above are repeated.

In step 718, the Run-to-Run control is terminated when the plasma processing is interrupted due to a control error or the plasma processing apparatus stops due to a failure in the plasma processing apparatus, or upon completion of the plasma processing of a predetermined number of wafers.

Thus, the controller 308 carries out the Run-to-Run control based on the flow of the Run-to-Run control in accordance with the present invention described above. Hence, the present invention allows uninterrupted Run-to-Run control to be accomplished with a minimized chance of the occurrence of a control error, making it possible to obtain stable, desired process performance results without lowering the operating rate of a plasma processing apparatus.

The present embodiment has taken the plasma etching as an example of plasma processing. However, the Run-to-Run control in accordance with the present invention may be applied to other types of plasma processing, such as forming films by plasma sputtering or plasma-enhanced chemical vapor deposition (plasma CVD), and plasma ashing.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method for carrying out plasma processing on a wafer under Run-to-Run control by using a plasma processing apparatus having a plasma processing chamber in which plasma processing is carried out, a process monitor which monitors a condition in the plasma processing chamber, and an actuator which controls parameters which are constituent elements of a plasma processing condition, the method comprising the steps of:
   making one of the parameters a (N−1)th manipulated variable;
   calculating a first difference between a process monitor value in the plasma processing obtained by the process monitor and a desired value of the process monitor value in the plasma processing;
   calculating a correction amount of the (N−1)th manipulated variable on the basis of the first difference and a previously obtained correlation between the process monitor value in the plasma processing and the (N−1)th manipulated variable;
   wherein N is a natural number equal to or larger than 2, determining whether or not the (N−1)th manipulated variable exceeds a limit value of the (N−1)th manipulated variable on the basis of the correction amount of the (N−1)th manipulated variable;
   calculating an Nth difference between the monitor value in the plasma processing and a monitor value calculated, as a case that the (N−1)th manipulated variable is a limit value, from the previously obtained correlation between the monitor value in the plasma processing and the (N−1)th manipulated variable; and
   calculating a correction amount of the Nth manipulated variable on the basis of the previously obtained correlation between the monitor value in the plasma processing and the Nth manipulated variable and the Nth difference; and
   wherein determining that the (N−1)th manipulated variable exceeds a limit value of the (N−1)th manipulated variable on the basis of the correction amount of the (N−1)th manipulated variable, correcting a plasma processing condition of a next wafer on the basis of the correction amount of the (N−1)th manipulated variable which causes the (N−1)th manipulated variable to be set to the limit value of the (N−1)th manipulated variable and the correction amount of the calculated Nth manipulated variable.

2. The plasma processing method according to claim 1, further comprising the steps of:
   determining whether or not the Nth manipulated variable exceeds a limit value of the Nth manipulated variable on the basis of the correction amount of the Nth manipulated variable;
   calculating an (N+1)th difference between the monitor value in the plasma processing and a monitor value calculated, as a case that the Nth manipulated variable is a limit value, from the previously obtained correlation between the monitor value in the plasma processing and the Nth manipulated variable; and
   calculating a correction amount of the (N+1)th manipulated variable on the basis of the preciously obtained correlation between the monitor value in the plasma processing and the (N+1)th manipulated variable and the (N+1)th difference, and
   wherein, when determining that the (N−1)th manipulated variable exceeds the limit value of the (N−1)th manipulated variable on the basis of the correction amount of the (N−1)th manipulated variable, and determining that the Nth manipulated variable does not exceed the limit value of the Nth manipulated variable on the basis of the correction amount of the Nth manipulated variable, setting the correction amount of the (N+1)th manipulated variable to zero, and correcting the plasma processing condition of the next wafer on the basis of the correction amount of the (N−1)th manipulated variable which causes the (N−1)th manipulated variable to be set the limit value of the (N−1)th manipulated variable and the correction amount of the calculated Nth manipulated variable.

3. The plasma processing method according to claim 1, wherein the N is 2, and the plasma processing is a plasma etching.

4. The plasma processing method according to claim 2, wherein the N is 2, and the plasma processing is a plasma etching.

5. The plasma processing method according to claim 3, wherein the (N−1)th manipulated variable is a flow rate of a gas provided in the plasma processing chamber.

6. The plasma processing method according to claim 3, wherein one of the (N−1)th and the Nth manipulated variable is a flow rate of a gas provided in the plasma processing chamber.

7. The plasma processing method according to claim 5, wherein the other of the (N−1)th and the Nth manipulated variable is a radio frequency bias power provided in the plasma processing chamber.

* * * * *

UNITED STATES PATENT AND TRADEMARK OFFICE
CERTIFICATE OF CORRECTION

PATENT NO. : 9,824,866 B2
APPLICATION NO. : 14/449516
DATED : November 21, 2017
INVENTOR(S) : Akira Kagoshima et al.

It is certified that error appears in the above-identified patent and that said Letters Patent is hereby corrected as shown below:

On the Title Page

Item (71) Applicant:
"Hitachi High-Technologies Corporation, Yamaguchi (JP)"
Should read:
-- Hitachi High-Technologies Corporation, Tokyo (JP) --

Signed and Sealed this
Second Day of October, 2018

Andrei Iancu
*Director of the United States Patent and Trademark Office*